(12) United States Patent
Tsuboi et al.

(10) Patent No.: US 6,487,137 B2
(45) Date of Patent: Nov. 26, 2002

(54) SEMICONDUCTOR MEMORY DEVICE HAVING A SECOND VOLTAGE SUPPLIER SUPPLYING TRANSFER GATES WITH A SECOND VOLTAGE HIGHER THAN A FIRST VOLTAGE

(75) Inventors: Hiroyoshi Tsuboi, Kawasaki (JP); Shinya Fujioka, Kawasaki (JP); Koichi Nishimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/924,469

(22) Filed: Aug. 9, 2001

(65) Prior Publication Data

US 2002/0024868 A1 Feb. 28, 2002

(30) Foreign Application Priority Data

Aug. 29, 2000 (JP) ........................................ 2000-259579

(51) Int. Cl.$^7$ .................................................. G11C 7/00
(52) U.S. Cl. ........................ 365/226; 365/201; 365/205; 365/207; 365/208; 365/189.11
(58) Field of Search ................................ 365/201, 205, 365/207, 208, 189.11, 226

(56) References Cited

U.S. PATENT DOCUMENTS

| | | | | |
|---|---|---|---|---|
| 5,394,374 A | * | 2/1995 | Ishimura et al. | 365/189.11 |
| 5,862,095 A | * | 1/1999 | Takahashi et al. | 365/222 |
| 5,894,445 A | * | 4/1999 | Kobayashi | 365/201 |
| 6,088,819 A | * | 7/2000 | Adachi et al. | 365/189.01 |
| 6,181,618 B1 | * | 1/2001 | Inaba et al. | 365/189.03 |

* cited by examiner

*Primary Examiner*—Richard Elms
*Assistant Examiner*—Toan Le
(74) *Attorney, Agent, or Firm*—Arent Fox Kintner Plotkin & Kahn, PLLC

(57) ABSTRACT

A semiconductor memory device which includes at least two memory cell arrays, a sense amplifier shared by the memory cell arrays and at least two transfer gates connected respectively between each of the memory cell arrays and the sense amplifier. The semiconductor memory device further includes a first voltage supplier supplying a first voltage to the transfer gates, and a second voltage supplier supplying a second voltage to the transfer gates, with second voltage being higher than the first voltage.

10 Claims, 7 Drawing Sheets

SEMICONDUCTOR MEMORY DEVICE HAVING A SECOND VOLTAGE SUPPLIER SUPPLYING TRANSFER GATES WITH A SECOND VOLTAGE HIGHER THAN A FIRST VOLTAGE

BACKGROUND OF THE INVENTION

1. Field of the Invention

The present invention generally relates to a semiconductor memory device and a testing method thereof, and more particularly, to a semiconductor memory device and a testing method thereof which device is tested by using a high voltage.

2. Description of the Related Art

In developing a semiconductor memory device, reducing a circuit scale has always been a concern, and thus conventional technologies have devised a semiconductor memory device having a plurality of memory cell arrays sharing a sense amplifier. The sense amplifier is generally referred to as a shared sense amplifier.

In the semiconductor memory device having the above-mentioned structure, two memory cell arrays, for example, share a sense amplifier. A gate, referred to as a bit-line transfer (BT) gate, is provided between each of the memory cell arrays and the sense amplifier. The opening and closing of each of the BT gates is controlled according to which of the memory cell arrays is targeted in reading data so that data is read selectively from either of the memory cell arrays into the sense amplifier.

Conventionally, the above-mentioned BT gates are controlled by a method referred to as "VPP driving method via VDD". In the "VPP driving method via VDD", the electric potentials of BT gate drive lines regulating the opening and closing of the BT gates are at the level of a power-source voltage VDD in a standby state, and then in reading or writing data, the level is driven to the level of a boosted voltage VPP or a ground voltage VSS. This method is effective in reducing an amount of electric power being consumed compared to a method of driving the BT gates continuously by the boosted voltage VPP.

However, in a wafer-level burn-in (WLBI) test, when applying a voltage of, for example, 4V to a bit line, a voltage higher than the 4V by a threshold voltage of transistors composing the BT gate has to be applied to gates of the transistors. Raising the level of the above-mentioned power-source voltage VDD to a level higher than the 4V imposes unnecessary stress on the sense amplifier supplied with the power-source voltage VDD and controlling circuits thereof, more specifically, transistors and other devices included in these circuits, the transistors and other devices having a short-length gate and driven by the internal power-source voltage. Hence, there is a problem that a WLBI test cannot be sufficiently performed.

It is noted that the "WLBI test" here means a test investigating stresses such as a leak between adjacent bit lines, or between opposing memory cells connected to a bit line leading to a sense amplifier.

SUMMARY OF THE INVENTION

It is a general object of the present invention to provide an improved and useful semiconductor memory device and a testing method thereof in which device and method the above-mentioned problems are eliminated.

A more specific object of the present invention is to provide a semiconductor memory device which device can be tested by using a high voltage with ease, and a testing method thereof which method can test a semiconductor memory device by using a high voltage with ease.

In order to achieve the above-mentioned objects, there is provided according to one aspect of the present invention a semiconductor memory device comprising:

at least two memory cell arrays;

a sense amplifier shared by the memory cell arrays;

at least two transfer gates connected respectively between each of the memory cell arrays and the sense amplifier;

a first voltage supplier supplying a first voltage to the transfer gates; and a second voltage supplier supplying a second voltage to the transfer gates, the second voltage being higher than the first voltage.

The present invention can prevent unnecessary stress from imposing on unintended circuits of the semiconductor memory device.

Additionally, the semiconductor memory device according to the present invention may have a normal-operation mode and a test mode testing a quality of the memory cell arrays, wherein the second voltage supplier may be activated only in the test mode.

According to the present invention, a test testing a quality of the memory cell arrays can be easily performed.

Additionally, in the semiconductor memory device according to the present invention, the first voltage supplier may supply the transfer gates with the first voltage, in a first state in the normal-operation mode, and may supply at least one of the transfer gates with one of voltages opening and closing the transfer gate, in a second state in the normal-operation mode.

According to the present invention, reading and writing data from/to the memory cell arrays can be performed easily.

Additionally, in the semiconductor memory device according to the present invention, the second voltage supplier may supply the second voltage to all of the transfer gates.

According to the present invention, the above-mentioned test can be performed to all of the memory cell arrays at the same time.

Specifically, in the semiconductor memory device according to the present invention, each of the transfer gates may include at least one transistor having a gate supplied with the first voltage and the second voltage.

In order to achieve the above-mentioned objects, there is also provided according to another aspect of the present invention a method of testing a semiconductor memory device including at least two memory cell arrays, a sense amplifier shared by the memory cell arrays, and at least two transfer gates connected respectively between each of the memory cell arrays and the sense amplifier, the method comprising the step of:

supplying the transfer gates with a higher voltage in a test than a voltage supplied in a normal operation.

The testing method according to the present invention can prevent unnecessary stress from imposing on unintended circuits of the semiconductor memory device.

Additionally, in the method according to the present invention, the semiconductor memory device may have a test mode testing a quality of the memory cell arrays, and the step of supplying may include regulating the higher voltage supplied to the transfer gates according to a signal activated by the semiconductor memory device in the test mode.

According to the present invention, a test testing a quality of the memory cell arrays can be easily performed.

Additionally, the method according to the present invention may further comprise the steps of:

supplying the transfer gates with a first voltage, in a first state in the normal operation; and supplying at least one of the transfer gates with one of second and third voltages opening and closing the transfer gate, in a second state in the normal operation.

According to the present invention, reading and writing data from/to the memory cell arrays can be performed easily.

Additionally, in the method according to the present invention, the step of supplying may supply the higher voltage to all of the transfer gates.

According to the present invention, the above-mentioned test can be performed to all of the memory cell arrays at the same time.

Specifically, in the method according to the present invention, each of the transfer gates may include at least one transistor, and the step of supplying may supply the higher voltage to a gate of the transistor.

Other objects, features and advantages of the present invention will become more apparent from the following detailed description when read in conjunction with the accompanying drawings.

DETAILED DESCRIPTION OF THE PREFERRED EMBODIMENTS

Figure 1:
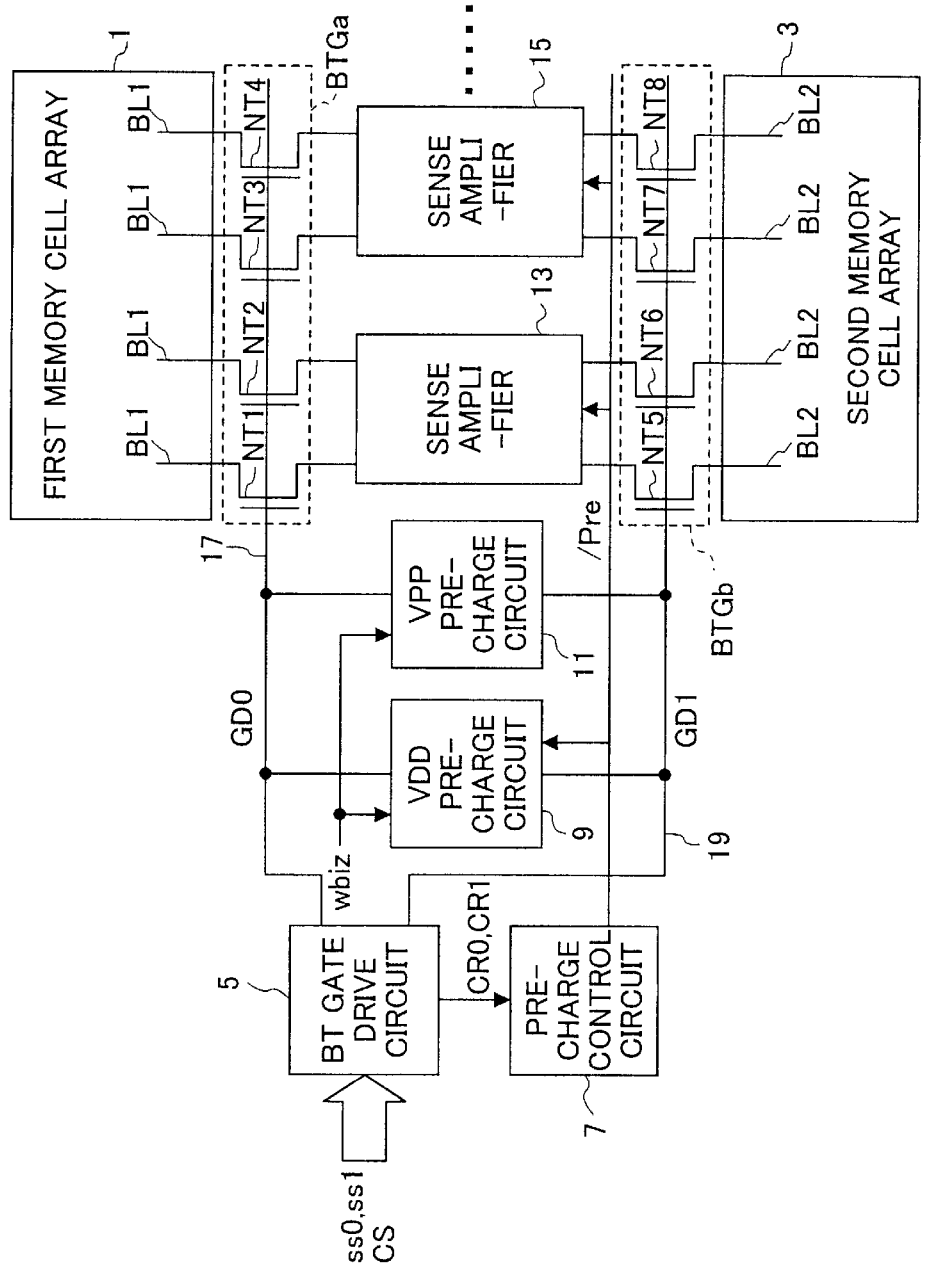
FIG. 1 is a block diagram showing a structure of a semiconductor memory device according to an embodiment of the present invention.

A description will now be given, with reference to the drawings, of embodiments according to the present invention. Elements in the drawings that are identical or equivalent are referenced by the same characters.

FIG. 1 is a block diagram showing a structure of a semiconductor memory device according to an embodiment of the present invention. As shown in FIG. 1, the semiconductor memory device according to the present embodiment comprises a first memory cell array 1 including bit lines BL1, a second memory cell array 3 including bit lines BL2, a BT (bit-line transfer) gate drive circuit 5, a precharge control circuit 7, a VDD precharge circuit 9, a VPP precharge circuit (a second voltage supplier) 11, sense amplifiers 13 and 15, BT gate drive lines 17 and 19, and BT gates BTGa and BTGb. The Bt gate BTGa includes N-channel MOS transistors NT1 to NT4. The Bt gate BTGb includes N-channel MOS transistors NT5 to NT8. It is noted that the BT (bit-line transfer) gate drive circuit 5 and the VDD precharge circuit 9 compose a first voltage supplier.

The first memory cell array 1 is connected to the sense amplifiers 13 and 15 via the BT gate BTGa. The second memory cell array 3 is connected to the sense amplifiers 13 and 15 via the BT gate BTGb. The BT gate drive circuit 5 is supplied with selective signals ss0 and ss1 and a column-selective signal cs. The BT gate drive circuit 5 supplies a BT gate drive signal GD0 to gates of the N-channel MOS transistors NT1 to NT4 via the BT gate drive line 17, and supplies a BT gate drive signal GD1 to gates of the N-channel MOS transistors NT5 to NT8 via the BT gate drive line 19.

The precharge control circuit 7 is connected to the BT gate drive circuit 5 and is supplied with control signals CR0 and CR1. The precharge control circuit 7 supplies a precharge signal /PRE to the VDD precharge circuit 9 and the sense amplifiers 13 and 15.

The VDD precharge circuit 9 and the VPP precharge circuit 11 are connected in parallel between the BT gate drive lines 17 and 19, and are supplied with a mode-switchover signal wbiz.

The semiconductor memory device having the above-described structure has a normal-operation mode and a WLBI (wafer-level burn-in) test mode. The mode-switchover signal wbiz is at a low level in the normal-operation mode, and is at a high level in the WLBI test mode.

The semiconductor memory device according to the present embodiment is characterized by using the above-mentioned mode-switchover signal wbiz to precharge the BT gate drive lines 17 and 19 with a boosted voltage VPP so as to drive the BT gates BTGa and BTGb with the boosted voltage VPP in a WLBI test.

Figure 2A:
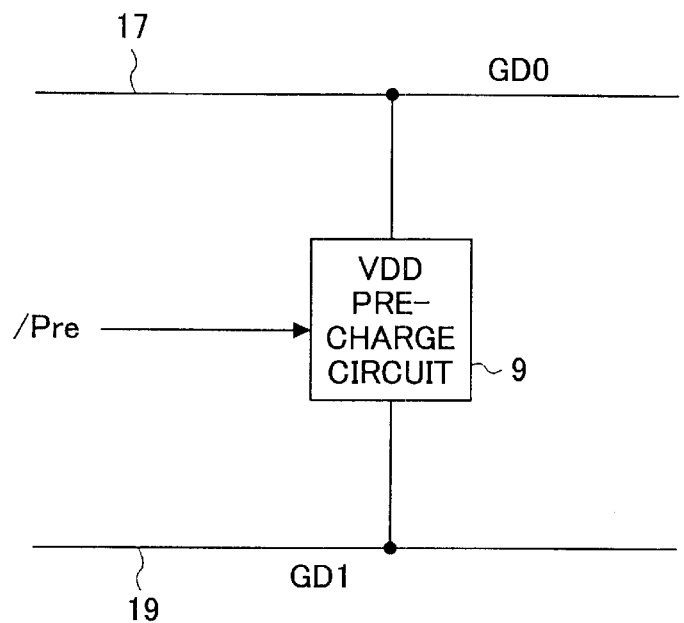
FIG. 2A and FIG. 2B are illustrations for explaining features of the semiconductor memory device shown in FIG. 1.
Figure 2B:
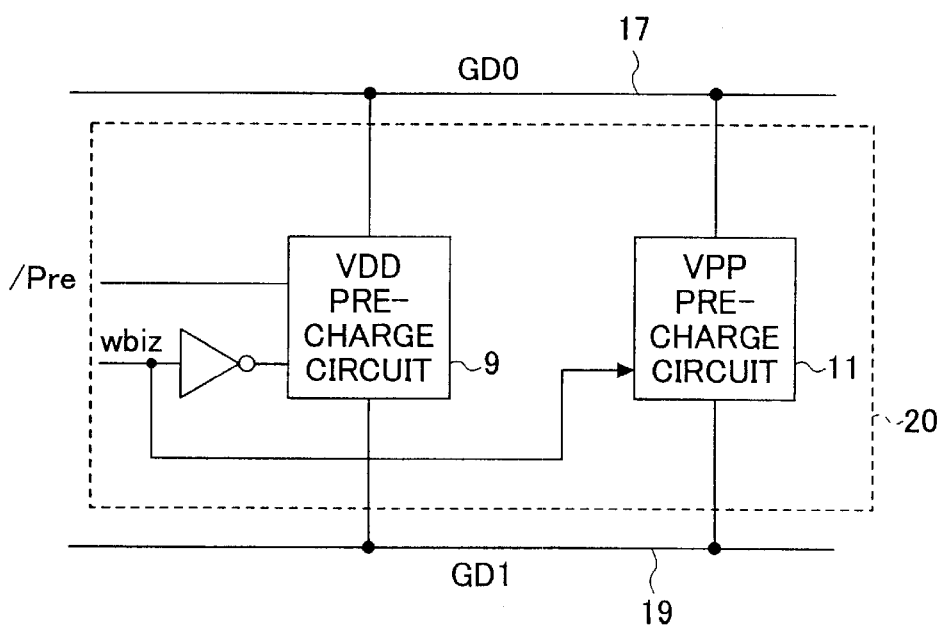

Specifically, in a conventional technology, only the VDD precharge circuit 9 is provided as a circuit pre-charging the BT gate drive lines 17 and 19, as shown in FIG. 2A, the VDD precharge circuit 9 supplying a power-source voltage VDD (a first voltage) to the BT gate drive lines 17 and 19 according to the precharge signal/PRE supplied from the precharge control circuit 7. However, in the semiconductor memory device according to the present embodiment, the VPP precharge circuit 11 is further provided between the BT gate drive lines 17 and 19, as shown in FIG. 2B, so as to supply the boosted voltage VPP (a second voltage) to the BT gate drive lines 17 and 19 according to the mode-switchover signal wbiz.

It is noted that the power-source voltage VDD is supplied from an external power source, and that the boosted voltage VPP is generated by boosting the power-source voltage VDD in the semiconductor memory device. For example, the power-source voltage VDD is 4V, a threshold voltage of the N-channel MOS transistors NT1 to NT8 is 1V, and the boosted voltage VPP is 5V.

Figure 3:
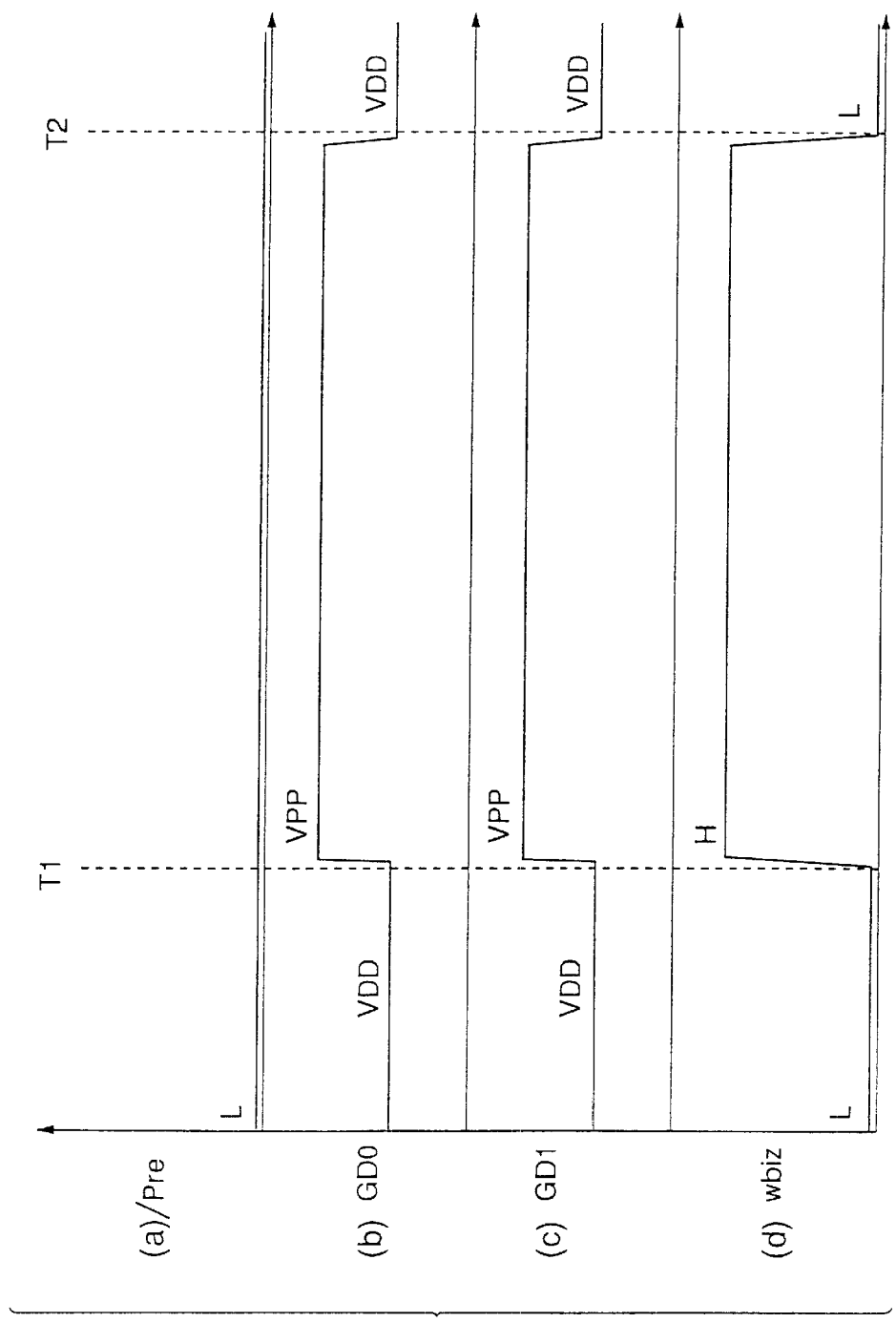
FIG. 3 is a first timing diagram indicating operations of the semiconductor memory device shown in FIG. 1.

Hereinbelow, a brief description will be given, with reference to FIG. 3, of operations of the semiconductor memory device according to the present embodiment shown in FIG. 1. FIG. 3 is a timing diagram indicating operations of the semiconductor memory device according to the present embodiment. First, the mode-switchover signal wbiz is at a low level in a normal-operation mode, as indicated by FIG. 3-(d), so that the VDD precharge circuit 9 is activated so as to precharge the BT gate drive lines 17 and 19 with the power-source voltage VDD, as indicated by FIG. 3-(b) and FIG. 3-(c). Then, when the mode-switchover signal wbiz is raised to a high level at a time T1 into a WLBI-test mode, as indicated by FIG. 3-(d), the VPP precharge circuit 11 is activated so as to precharge the BT gate drive lines 17 and 19 with the boosted voltage VPP, as indicated by FIG. 3-(b) and FIG. 3-(c).

Further, at a time T2 when a WLBI test is over, the mode-switchover signal wbiz is dropped to a low level into the normal-operation mode, as indicated by FIG. 3-(d). At this time, the VPP precharge circuit 11 is deactivated so that the BT gate drive lines 17 and 19 are pre-charged with the power-source voltage VDD, as indicated by FIG. 3-(b) and FIG. 3-(c). It should be noted that the precharge signal /PRE is at a low level all through the above-mentioned course, as indicated by FIG. 3-(a).

Figure 4:
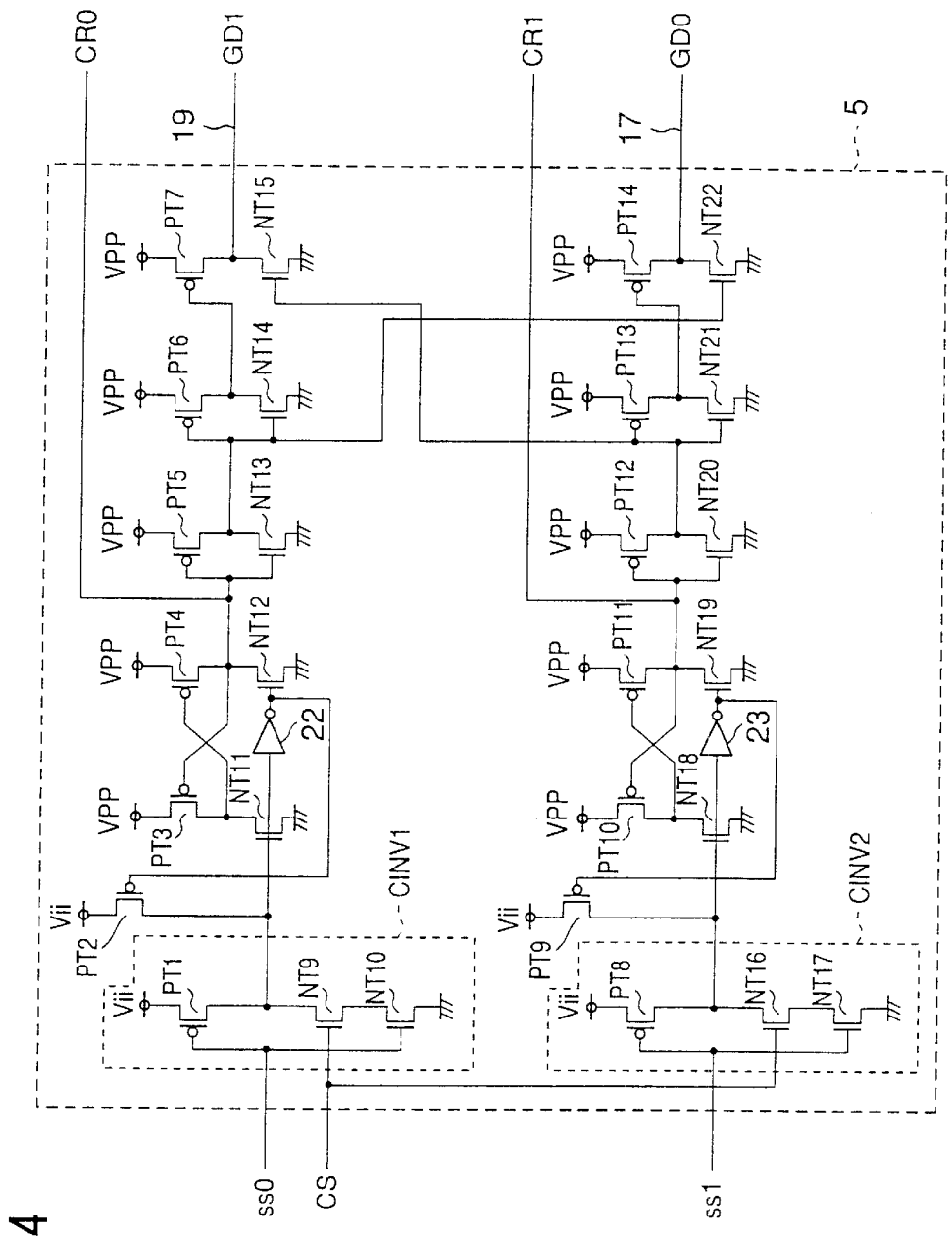
FIG. 4 is a circuit diagram showing a structure of a BT gate drive circuit shown in FIG. 1.

Hereinbelow, descriptions will be given, with reference to FIG. 4 to FIG. 7, of a specific structure of each of the circuits shown in FIG. 1. FIG. 4 is a circuit diagram showing a structure of the BT gate drive circuit 5 shown in FIG. 1. As shown in FIG. 4, the BT gate drive circuit 5 comprises inverting circuits 22 and 23, N-channel MOS transistors NT9 to NT22, and P-channel MOS transistors PT1 to PT14. In this structure, the N-channel MOS transistors NT9 and NT10, the P-channel MOS transistor PT1, an internal power-source voltage node Vii and a ground node compose a clocked inverter CINV1. Also, the N-channel MOS transistors NT16 and NT17, the P-channel MOS transistor PT8, an internal power-source voltage node Vii, and a ground node compose a clocked inverter CINV2.

In the BT gate drive circuit 5 having the above-mentioned structure, only when the column-selective signal cs is activated to a high level, the clocked inverters CINV1 and CINV2 are activated so that the clocked inverter CINV1 outputs an inverted signal of the selective signal ss0, and that the clocked inverter CINV2 outputs an inverted signal of the selective signal ss1.

Subsequently, the BT gate drive circuit 5 generates the control signal CR0 according to the selective signal ss0, the control signal CR0 being supplied to the precharge control circuit 7, and generates the control signal CR1 according to the selective signal ss1, the control signal CR1 being supplied to the precharge control circuit 7. In addition, the BT gate drive circuit 5 generates the BT gate drive signals GD0 and GD1 according to the selective signals ss0 and ss1.

Figure 5:
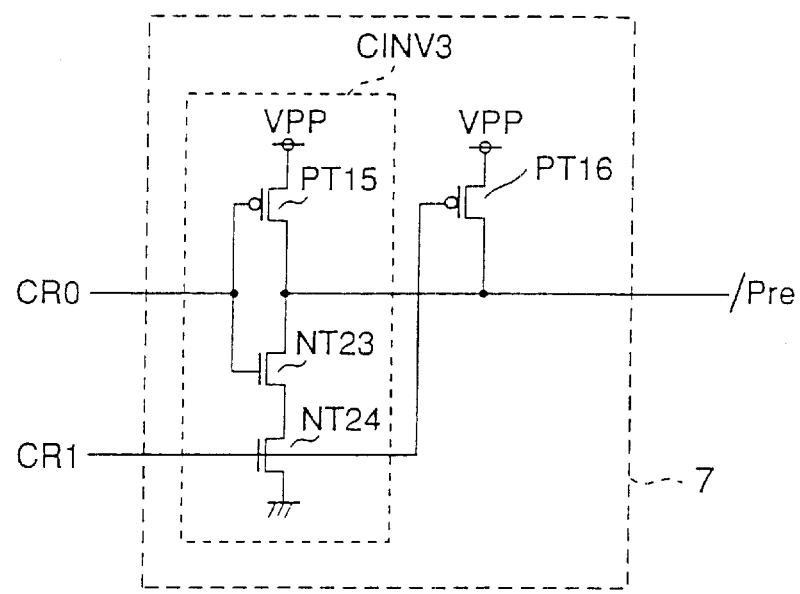
FIG. 5 is a circuit diagram showing a structure of a precharge control circuit shown in FIG. 1.

FIG. 5 is a circuit diagram showing a structure of the precharge control circuit 7 shown in FIG. 1. As shown in FIG. 5, the precharge control circuit 7 comprises N-channel MOS transistors NT23 and NT24 and P-channel MOS transistors PT15 and PT16. In this structure, the N-channel MOS transistors NT23 and NT24, the P-channel MOS transistor PT15, a node supplying the boosted voltage VPP, and a ground node compose a clocked inverter CINV3.

The precharge control circuit 7 having the above-mentioned structure is activated by the control signal CR1 supplied from the BT gate drive circuit 5, and generates and outputs the precharge signal /PRE according to the control signal CR0 supplied from the BT gate drive circuit 5.

Figure 6:
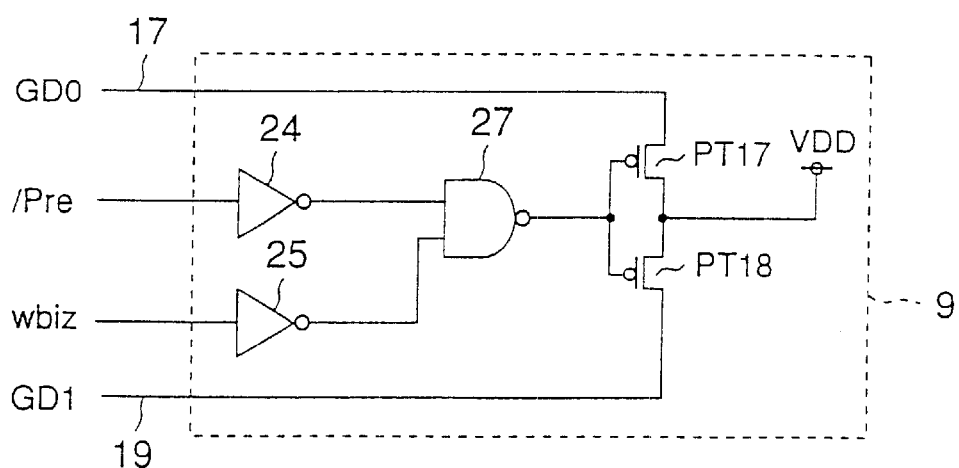
FIG. 6 is a circuit diagram showing a structure of a VDD precharge circuit shown in FIG. 1.

FIG. 6 is a circuit diagram showing a structure of the VDD precharge circuit 9 shown in FIG. 1. As shown in FIG. 6, the VDD precharge circuit 9 comprises inverting circuits 24 and 25, an AND circuit 27, and P-channel MOS transistors PT17 and PT18. In this structure, the inverting circuit 24 is supplied from the precharge control circuit 7 with the precharge signal /PRE, and the inverting circuit 25 is supplied with the mode-switchover signal wbiz. The VDD precharge circuit 9 supplies the power-source voltage VDD to the BT gate drive lines 17 and 19, only when the precharge signal /PRE is at a low level and the mode-switchover signal wbiz is at a low level.

Figure 7:
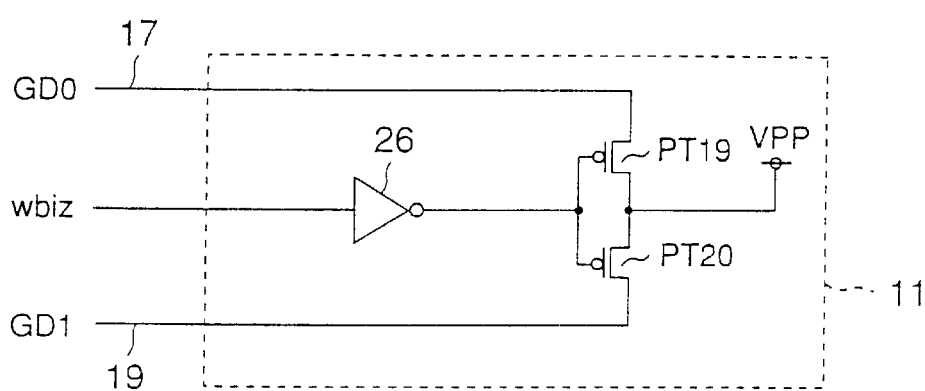
FIG. 7 is a circuit diagram showing a structure of a VPP precharge circuit shown in FIG. 1.

FIG. 7 is a circuit diagram showing a structure of the VPP precharge circuit 11 shown in FIG. 1. As shown in FIG. 7, the VPP precharge circuit 11 comprises an inverting circuit 26 and P-channel MOS transistors PT19 and PT20. In this structure, the inverting circuit 26 is supplied with the mode-switchover signal wbiz. The VPP precharge circuit 11 supplies the boosted voltage VPP to the BT gate drive lines 17 and 19, only when the mode-switchover signal wbiz is at a high level.

Figure 8:
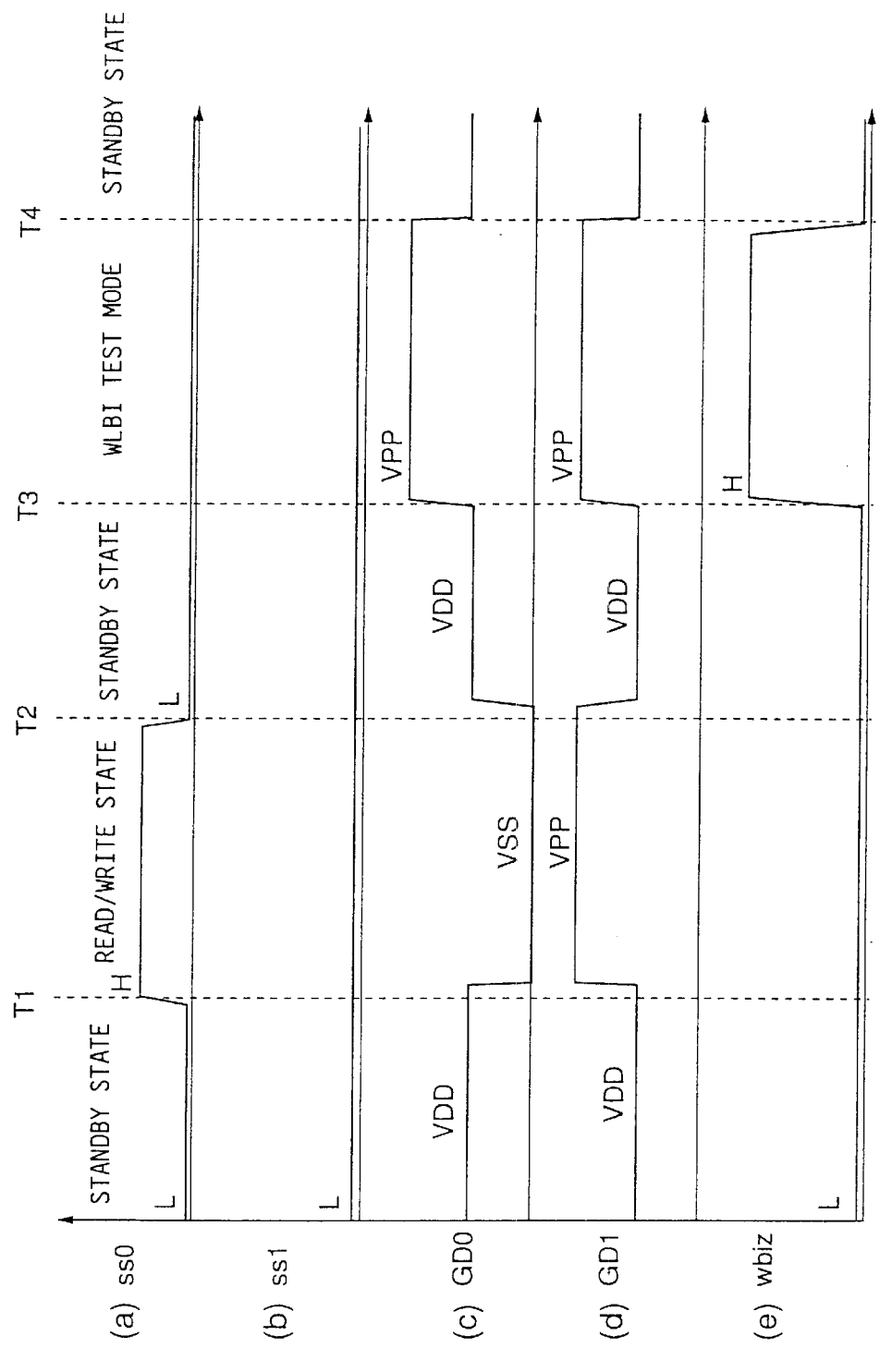
FIG. 8 is a second timing diagram indicating operations of the semiconductor memory device shown in FIG. 1.

Hereinbelow, a more detailed description will be given, with reference to FIG. 8, of operations of the semiconductor memory device according to the present embodiment. FIG. 8 is a timing diagram indicating operations of the semiconductor memory device according to the present embodiment. First, the mode-switchover signal wbiz is at a low level in a normal-operation mode until a time T3, as indicated by FIG. 8-(e). In standby states from an initial state to a time T1 and from a time T2 to the time T3, the selective signal ss0 is at a low level, as indicated by FIG. 8-(a). The selective signal ss1 is always at a low level until a time T4, as indicated by FIG. 8-(b).

In the above-mentioned standby states, the precharge control circuit 7 supplies the VDD precharge circuit 9 with the precharge signal /PRE activated at a low level so that the VDD precharge circuit 9 precharges the BT gate drive lines 17 and 19 with the power-source voltage VDD in the above-mentioned periods corresponding to the standby states (i.e., in a first state in the normal-operation mode).

In the period from the time T1 to the time T2, in order to read or write data (i.e., in a second state in the normal-operation mode), first the precharge signal /PRE generated in the precharge control circuit 7 is raised to a high level in this period so as to deactivate the VDD precharge circuit 9 shown in FIG. 6.

When data is to be read or written from or to the second memory cell array 3, the BT gate drive circuit 5 increases the voltage of the BT gate drive signal GD1 from the level of the power-source voltage VDD to the level of the boosted voltage VPP, as indicated by FIG. 8-(d), and decreases the voltage of the BT gate drive signal GD0 from the level of the power-source voltage VDD to the level of a ground voltage VSS, as indicated by FIG. 8-(c). Thereby, the N-channel MOS transistors NT1 to NT4 of the Bt gate BTGa are turned off, and the N-channel MOS transistors NT5 to NT8 of the Bt gate BTGb are turned on so as to selectively open the Bt gate BTGb.

Accordingly, in the period from the time T1 to the time T2, only the second memory cell array 3 is connected to the sense amplifiers 13 and 15 so that data is read or written from or to the second memory cell array 3.

Next, at the time T3 transiting from the normal-operation mode to the WLBI test mode, the mode-switchover signal wbiz is raised from the low level to a high level, as indicated by FIG. 8-(e). Thereby, the VDD precharge circuit 9 shown in FIG. 6 is deactivated, and the VPP precharge circuit 11 shown in FIG. 7 is activated so as to increase the voltages of the BT gate drive signals GD0 and GD1 from the level of the power-source voltage VDD to the level of the boosted voltage VPP, as indicated by FIG. 8-(c) and FIG. 8-(d).

Thereby, the gates of the N-channel MOS transistors NT1 to NT8 composing the Bt gates BTGa and BTGb are supplied with the boosted voltage VPP for performing a WLBI test.

As described above, in the semiconductor memory device according to the present embodiment, the boosted voltage VPP can be supplied only to the gates of the N-channel MOS transistors NT1 to NT8 composing the Bt gates BTGa and BTGb in a WLBI test. This avoids imposing unnecessary stress on the sense amplifiers 13 and 15 and controlling circuits thereof, more specifically, transistors and other devices included in these circuits, the transistors and other devices having a short-length gate and driven by the power-source voltage VDD.

Therefore, the semiconductor memory device according to the present embodiment enables a WLBI test to be sufficiently performed without imposing stress on undesired parts. This prevents the semiconductor memory device from deteriorating unnecessarily through the WLBI test.

Additionally, since the boosted voltage VPP can be supplied to all of the gates of the N-channel MOS transistors NT1 to NT8 composing the Bt gates BTGa and BTGb, a WLBI test can be performed to the first memory cell array 1 and the second memory cell array 3 at the same time; thus a WLBI test can be performed effectively.

Besides, in a conventional technology, in order to supply the boosted voltage VPP selectively to the Bt gate BTGa or BTGb, a circuit is required to be provided especially for performing the selection. However, the semiconductor memory device according to the present embodiment does not require such a circuit, enabling a WLBI test to be performed easily.

The present invention is not limited to the specifically disclosed embodiments, and variations and modifications may be made without departing from the scope of the present invention.

The present application is based on Japanese priority application No. 2000-259579 filed on Aug. 29, 2000, the entire contents of which are hereby incorporated by reference.

What is claimed is:

1. A semiconductor memory device comprising:
   at least two memory cell arrays;
   a sense amplifier shared by said memory cell arrays;
   at least two transfer gates connected respectively between each of said memory cell arrays and said sense amplifier;
   a first precharge voltage supplier supplying a first precharge voltage to said transfer gates; and
   a second precharge voltage supplier supplying a second precharge voltage to said transfer gates, the second precharge voltage being higher than said first precharge voltage.

2. The semiconductor memory device as claimed in claim 1, having a normal-operation mode and a test mode testing a quality of said memory cell arrays, wherein said second precharge voltage supplier is activated only in said test mode.

3. The semiconductor memory device as claimed in claim 2, wherein said first precharge voltage supplier supplies said transfer gates with said first precharge voltage, in a first state in said normal-operation mode, and supplies at least one of said transfer gates with one of voltages opening and closing the transfer gate, in a second state in said normal-operation mode.

4. The semiconductor memory device as claimed in claim 1, wherein said second precharge voltage supplier supplies said second precharge voltage to all of said transfer gates.

5. The semiconductor memory device as claimed in claim 1, wherein each of said transfer gates includes at least one transistor having a gate supplied with said first precharge voltage and said second precharge voltage.

6. A method of testing a semiconductor memory device including at least two memory cell arrays, a sense amplifier shared by said memory cell arrays, and at least two transfer gates connected respectively between each of said memory cell arrays and said sense amplifier, the method comprising the step of:
   supplying said transfer gates with a higher precharge voltage in a test than a precharge voltage supplied in a normal operation.

7. The method as claimed in claim 6, wherein said semiconductor memory device has a test mode testing a quality of said memory cell arrays, and said step of supplying includes regulating said higher precharge voltage supplied to said transfer gates according to a signal activated by said semiconductor memory device in said test mode.

8. The method as claimed in claim 6, further comprising the steps of:
   supplying said transfer gates with a first precharge voltage, in a first state in said normal operation; and
   supplying at least one of said transfer gates with one of second and third precharge voltages opening and closing the transfer gate, in a second state in said normal operation.

9. The method as claimed in claim 6, wherein said step of supplying supplies said higher precharge voltage to all of said transfer gates.

10. The method as claimed in claim 6, wherein each of said transfer gates includes at least one transistor, and said step of supplying supplies said higher precharge a gate of said transistor.

* * * * *